(12) United States Patent
Clevenger et al.

(10) Patent No.: US 6,743,670 B2
(45) Date of Patent: Jun. 1, 2004

(54) HIGH DIELECTRIC CONSTANT MATERIALS FORMING COMPONENTS OF DRAM SUCH AS DEEP-TRENCH CAPACITORS AND GATE DIELECTRIC (INSULATORS) FOR SUPPORT CIRCUITS

(75) Inventors: Lawrence A. Clevenger, LaGrangeville, NY (US); Louis L. Hsu, Fishkill, NY (US); Carl J Radens, LaGrangeville, NY (US); Joseph F. Shepard, Jr., Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/382,894

(22) Filed: Mar. 6, 2003

(65) Prior Publication Data

US 2003/0151073 A1 Aug. 14, 2003

Related U.S. Application Data

(62) Division of application No. 09/924,549, filed on Aug. 9, 2001, now Pat. No. 6,563,160.

(51) Int. Cl.[7] .......................................... H01L 21/8242
(52) U.S. Cl. ...................... 438/243; 438/241; 438/242; 438/244; 257/301; 257/304
(58) Field of Search ................................ 438/241–244, 438/386–387; 257/301–306

(56) References Cited

U.S. PATENT DOCUMENTS 6,174,780 B1    1/2001  Robinson
6,238,967 B1    5/2001  Shiho et al.

*Primary Examiner*—Dung A. Le
(74) *Attorney, Agent, or Firm*—McGinn & Gibb, PLLC; Casey P. August, Esq.

(57) ABSTRACT

A method and structure for an improved DRAM (dynamic random access memory) dielectric structure, whereby a new high-k material is implemented for both the support devices used as the gate dielectric as well as the capacitor dielectric. The method forms both deep isolated trench regions used for capacitor devices, and shallow isolated trench regions for support devices. The method also forms two different insulator layers, where one insulator layer with a uniform high-k dielectric constant is used for the deep trench regions and the support regions. The other insulator layer is used in the array regions in between the shallow trench regions.

8 Claims, 8 Drawing Sheets

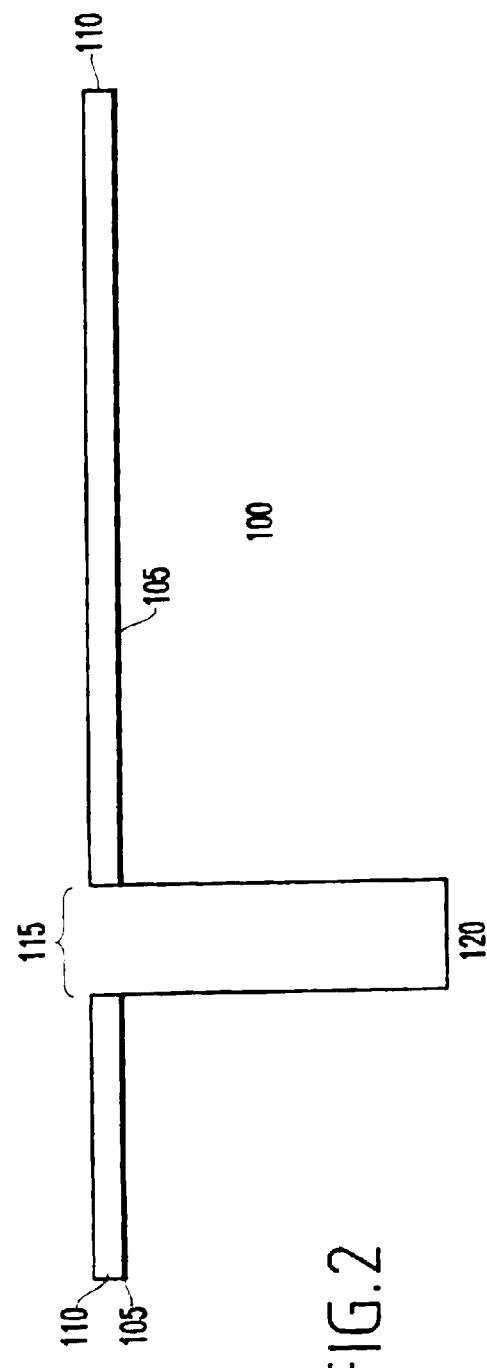
FIG.1
FIG.2

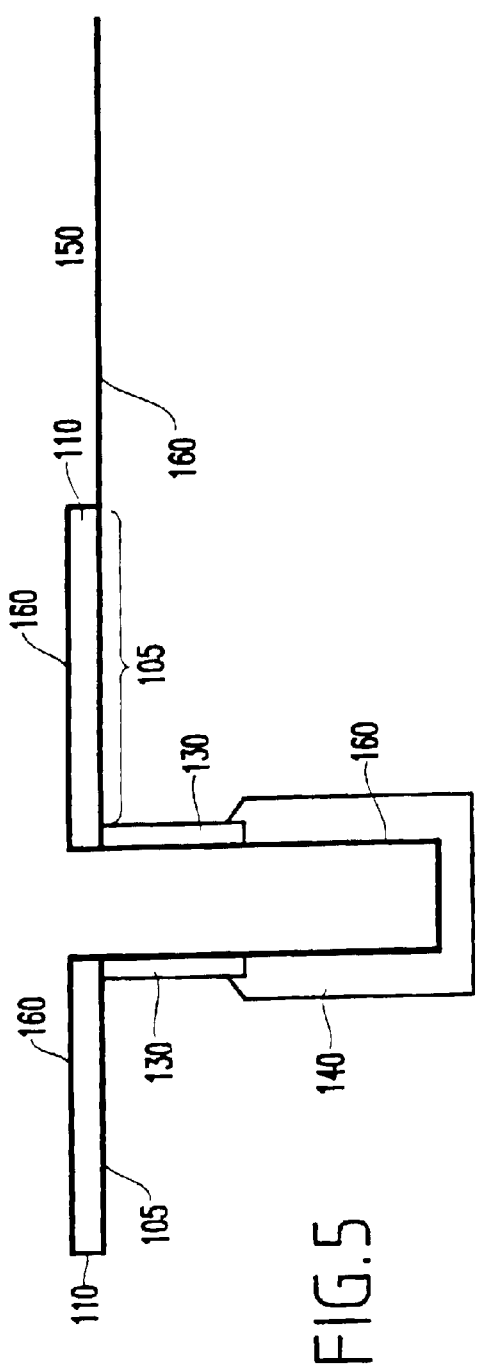
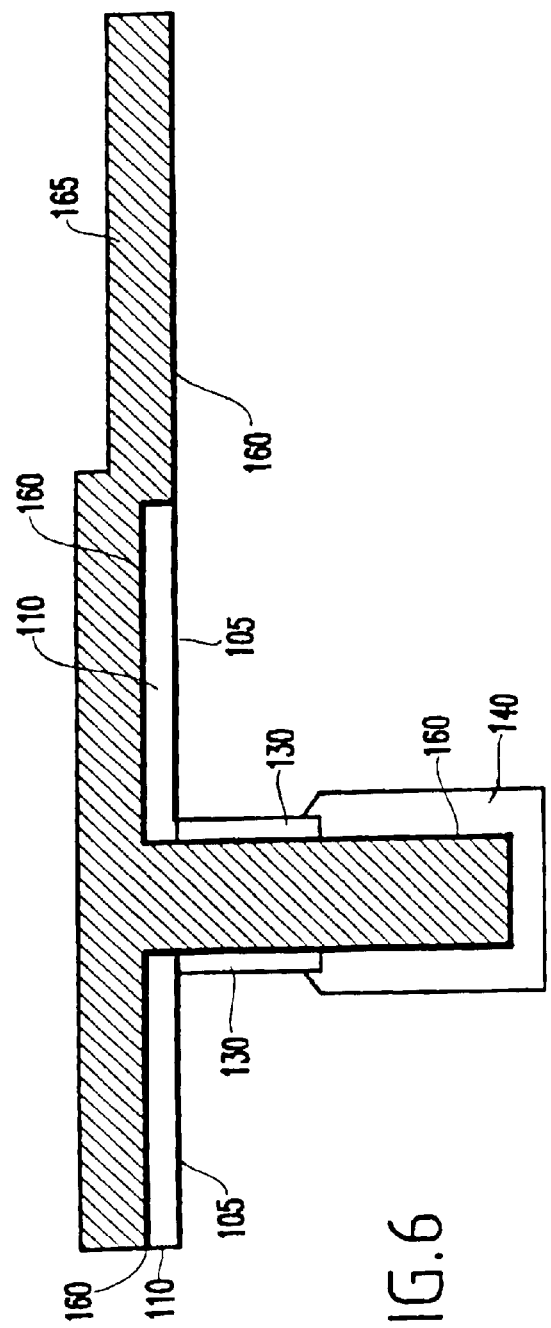

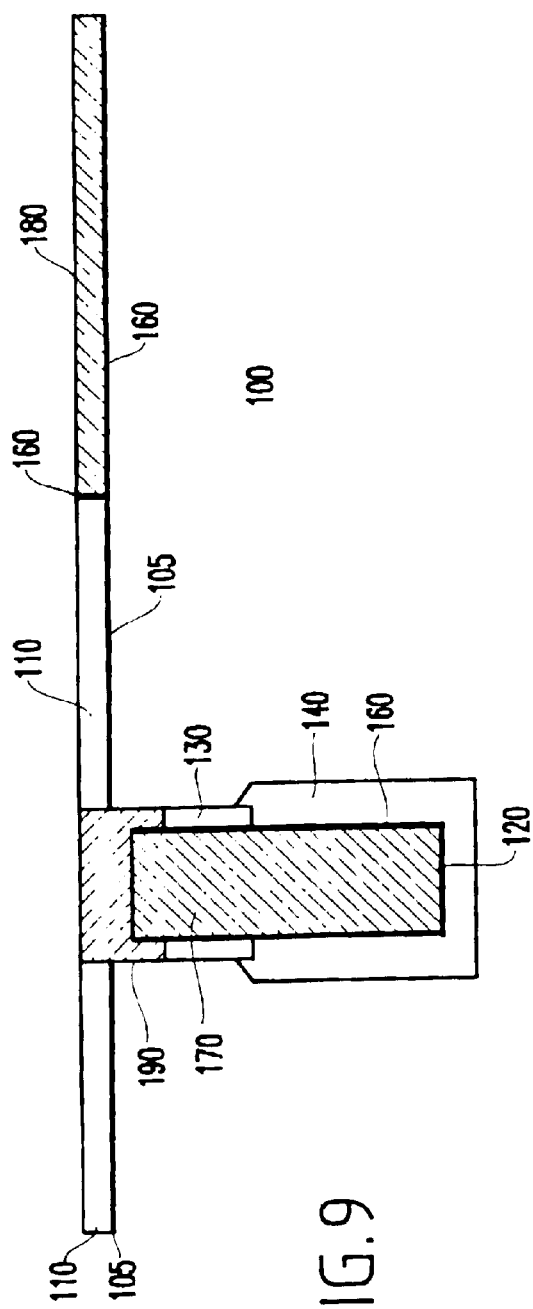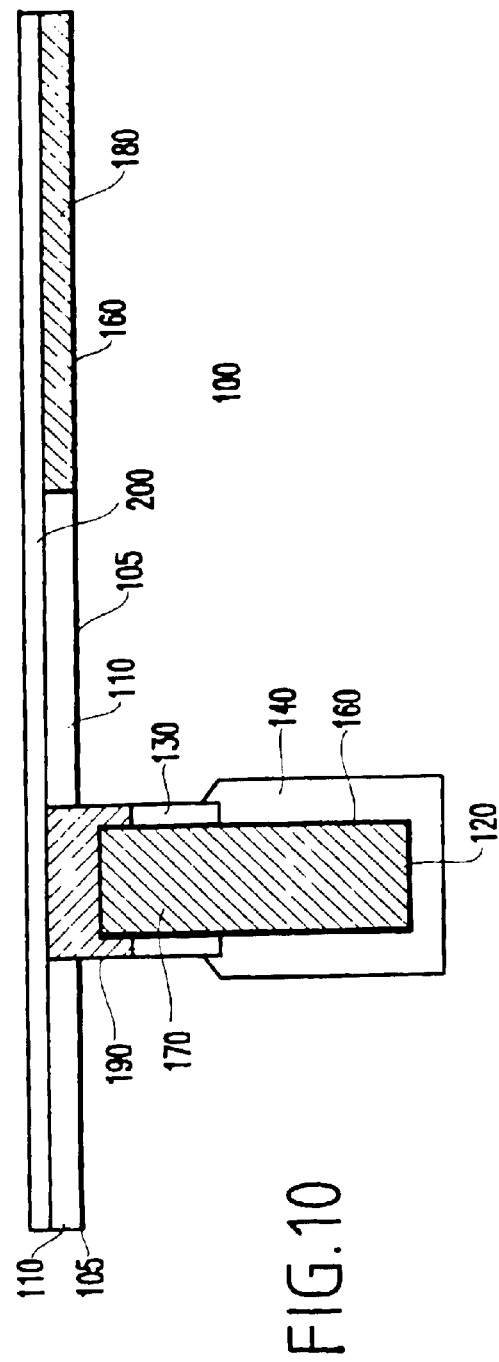

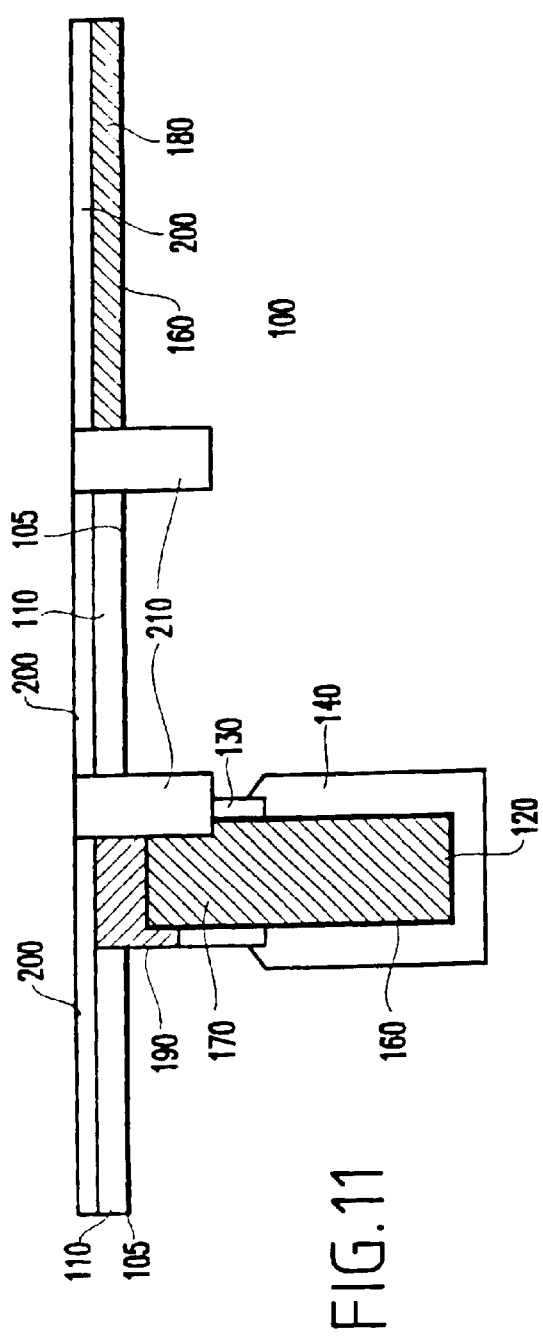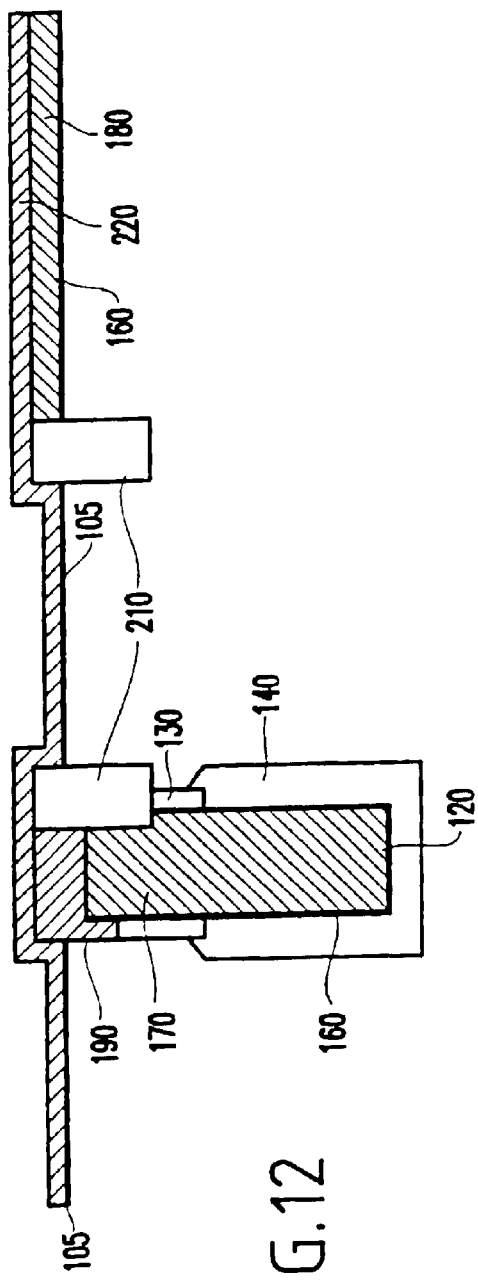

HIGH DIELECTRIC CONSTANT MATERIALS FORMING COMPONENTS OF DRAM SUCH AS DEEP-TRENCH CAPACITORS AND GATE DIELECTRIC (INSULATORS) FOR SUPPORT CIRCUITS

CROSS-REFERENCE TO RELATED APPLICATIONS

This application is a division of U.S. application Ser. No. 09/924,549 filed Aug. 9, 2001 now U.S. Pat. No. 6,563,160.

BACKGROUND OF THE INVENTION

1. Field of the Invention

The present invention generally relates to integrated storage devices and more particularly to an improved dynamic random access memory dielectric structure, and the method for producing the same.

2. Description of the Related Art

DRAM, the dynamic random access memory, is known to have a much higher memory density than the SRAM, or the static random access memory. Usually, in order to achieve a high integration density, either a deep trench-capacitor or a high-k dielectric stack-capacitor cell is employed. Although the deep trench capacitor has a planar surface topography, the depth of the trench has become the limiting factor in preventing the scaling of DRAM exceeding 4 gigabytes. However, the high-k dielectric stack-capacitor cell is limited by the material stability as well as the topography. Here, the stack-capacitor is built on top of the silicon surface. Thus, the resulting non-planar surface has created problems for metallization as well as lithographic patterning. Conversely, the performance of the DRAM that is determined by the MOS device parameters, such as the gate dielectric thickness, channel length and width are now facing physical limitations. For example, MOS devices using conventional thermal oxide as the gate dielectric cannot be thinner than 3 nanometers in order to avoid a reliability concern. Moreover, if the device channel length is shorter than 0.1 micrometers, the result will be suffering from the short channel effect as well as the occurrence of a high-level leakage current.

As the channel width is limited by the chip area, the device performance degrades when the Vdd, the power supply, is reduced below 1 volt. Therefore, in order to replace DRAM with SRAM for cache applications, it is important that the device performance be maintained at its initial level, while the chip size is continuously reduced. In other words, DRAM access time, or cycle time must be in the range of 3 to 5 nanoseconds at low-power conditions. Thus, there is a need to reduce the cost and improve performance of DRAM.

SUMMARY OF THE INVENTION

In view of the foregoing and other problems, disadvantages, and drawbacks of the conventional DRAM structures, the present invention has been devised, and it is an object of the present invention to provide a structure and method for an improved DRAM structure.

The goal of this invention is to (1) improve the performance of DRAM, and (2) reduce the process cost. A new high-k material is implemented for both the support devices used as the gate dielectric as well as the capacitor dielectric. It is the first time that a high-k dielectric is used for a deep trench capacitor as well as the support devices. This will not only reduce the trench depth, but also improve the performance of the support devices because the high-k dielectric gate support device will enable a reduction in the equivalent gate oxide thickness, and hence an increase in the gage electrode control of the MOSFET channel, without degrading the reliability and gate leakage current of the thin dielectric device.

Since the high-k dielectric is applied at once, process steps are greatly reduced compared to the case when they are separately applied. The thermal budget is also reduced accordingly, since only one dielectric anneal is needed. The transfer gate of the array devices intentionally use the conventional dielectric to avoid any possibility of charge leakage that is commonly associated with high-k materials. The support devices, which require having a large drivability such as the wordline drivers, the OCDs (off-chip-driver), and the clock drivers, can improve their drivability without using a large device size due to the improved transistor performance of the high-k devices. This gives more room for higher-level and density of integration.

In order to attain the objects suggested above, there is provided, according to one aspect of the invention a method for producing a dynamic random access memory device with a high-k dielectric constant. More specifically, the method deposits a first insulator oxide layer and a passive insulator nitride layer on a substrate. Then, the invention forms multiple deep trench regions on the substrate. The deep trench regions each have exposed surfaces to allow for coating of conductive material. Furthermore, a pair of collars extend from the upper portions of the deep trench regions, and are diametrically opposed to each other. An $n^+$ diffusion region extends on the lower portion of the deep trench region. The $n^+$ diffusion layer for each trench is linked together by an $n^+$ buried layer and is used as the plate node of the capacitor array.

Then, the nitride layer and the oxide layer from the support area of the substrate are removed by dry or wet etchings. Next, a second insulator layer in the form of a high-k dielectric is deposited on the composite, including in the deep trench channel, where the dielectric is used as the trench dielectric as well as the gate dielectric for the support devices. After that, a first conductive layer is deposited above the second insulator layer. Then, a planarization process occurs where the composite is recessed in order to form a planar surface followed by a second recess which lowers the level of the first conductive layer located in the deep trench region.

Next, a second conductive layer in the form of $n^+$ doped polysilicon is deposited above the first conductive layer in the deep trench region to a level flush with an uppermost portion of the composite. Another insulator layer such as nitride is then deposited on top of the composite. Then, several shallow channel isolation regions are formed in the composite such that an upper portion of the shallow trench is above the second conductive layer.

Following that, the exposed first and second insulator layers in the form of nitride layers are removed using a dry or wet etching process. Next, a third conductive layer in the form of doped polysilicon is deposited on top of the composite. Then, a fourth conductive layer in the form of tungsten, or any proper refractory metal is deposited on top of the third conductive layer. The composite gates are then formed to create transfer devices and support devices. This is done by removing any exposed first and third conductive layers from the composite. Next, portions of the substrate are doped to form source and drain regions. Then, contacts are formed on top of the second insulator layer. Finally, a third insulator layer is deposited on top of the composite.

BRIEF DESCRIPTION OF THE DRAWINGS

The foregoing and other objects, aspects and advantages will be better understood from the following detailed description of a preferred embodiment(s) of the invention with reference to the drawings, in which:

FIG. 1 is a schematic diagram of a partially completed DRAM structure according to the present invention;

FIG. 2 is a schematic diagram of a partially completed DRAM structure according to the present invention;

FIG. 5 is a schematic diagram of a partially completed DRAM structure according to the present invention;

FIG. 6 is a schematic diagram of a partially completed DRAM structure according to the present invention;

FIG. 9 is a schematic diagram of a partially completed DRAM structure according to the present invention;

FIG. 10 is a schematic diagram of a partially completed DRAM structure according to the present invention;

FIG. 11 is a schematic diagram of a partially completed DRAM structure according to the present invention;

FIG. 12 is a schematic diagram of a partially completed DRAM structure according to the present invention;

DETAILED DESCRIPTION OF PREFERRED EMBODIMENTS OF THE INVENTION

Figure 3:
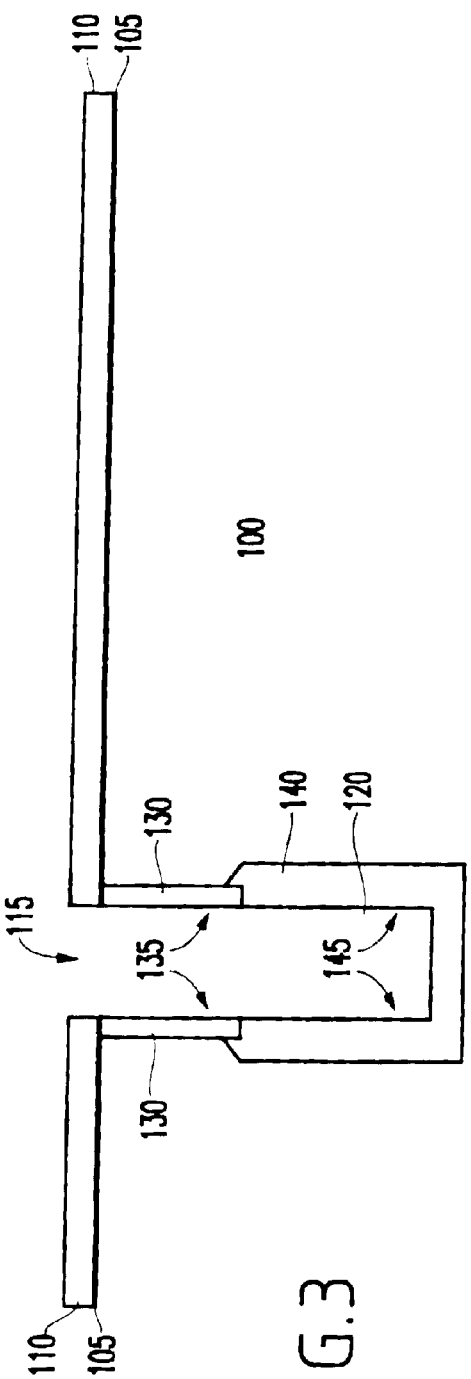
FIG. 3 is a schematic diagram of a partially completed DRAM structure according to the present invention.

As mentioned above, there is a need to reduce the cost and improve performance of DRAM. The invention addresses these needs by providing a single high-k material for both device gate dielectrics as well as capacitor dielectrics in a DRAM device. In a preferred embodiment the invention uses a high-k film made using atomic level chemical vapor deposition (ALCVD) techniques. Using ALCVD to deposit a combination of $La_2O_3/Al_2O_3$ obtains a dielectric constant between 10 and 30 depending on the ratio of Al to La. The invention uses deposition conditions that retain the amorphous nature of the film stack in order to prevent electrical leakage.

A new cell structure is proposed to form such a dielectric for both support gates and capacitor devices in one process step so as to significantly reduce the process cost. The high-k dielectric will not only improve the support device performance but will also boost the charge storage capability of the DRAM cells.

The high-k dielectric will provide a thinner equivalent dielectric thickness for both the gate and the capacitor. Therefore, the device drivability can be improved. Also, the depth of the trench, which houses the capacitor, can be significantly reduced. This will reduce the production cost by reducing the process (trench etch, deposition, etc.) time, and simultaneously, producing a higher yield.

The invention will also improve the trench series resistance. Normally, the trench series resistance consists of a transfer gate resistance, strap resistance, and trench electrode fill resistance. Although the gate resistance is negligibly small, the strap resistance is in the range of 40 k-ohm, while the deep trench could add another 20 to 40 k-ohm. However, if the trench is more shallow, the series resistance can be accordingly smaller because the electrode fill series resistance will be reduced.

The process mentioned in this disclosure is not restricted to any particular high-k dielectric. Thus, any stable high-k dielectric material such as $La_2O_3/Al_2O_3$ can be used. By using a deeper trench, this process will allow the same technology to integrate beyond 4G.

An example of fabricating such a low-cost and high-performance (eDRAM) is shown in FIGS. 1–15. However, as would be known to one ordinarily skilled in the art given this disclosure, the invention is not limited to the example shown and is applicable to all similar structures. Referring now to the drawings, and more particularly to FIG. 1, there are shown preferred embodiments of the method and structures according to the present invention.

In FIG. 1, a thin oxide layer 105 and a CVD (chemical vapor deposition) nitride layer 110 are deposited on a p-type substrate 100. Both the oxide layer 105 and the nitride layer 110 serve as insulator layers for the composite. In FIG. 2, a patterned trench RIE (reactive ion etching) and photolithography is carried out to form trenches 120 on the silicon substrate with the trenches being properly dimensioned and configured to form an orifice 115 in the substrate. In FIG. 3, conventional processing steps are used to form collar oxides 130 on the upper portion 135 of the trench 120. Furthermore, an $n^+$ diffusion region 140 is formed at the lower portion 145 of the trench 120 using any conventional dopins process, such as gas-phase diffusion or doped glass out diffusion.

The $n^+$ diffusion region 140 for each trench 120 will be linked together (not shown) by an implanted $n^+$ buried layer to be used as the plate node of the capacitor array. These basic processes are very familiar to those skilled in the art and are not discussed in detail herein so as not to obscure the salient features of the invention.

Figure 4:
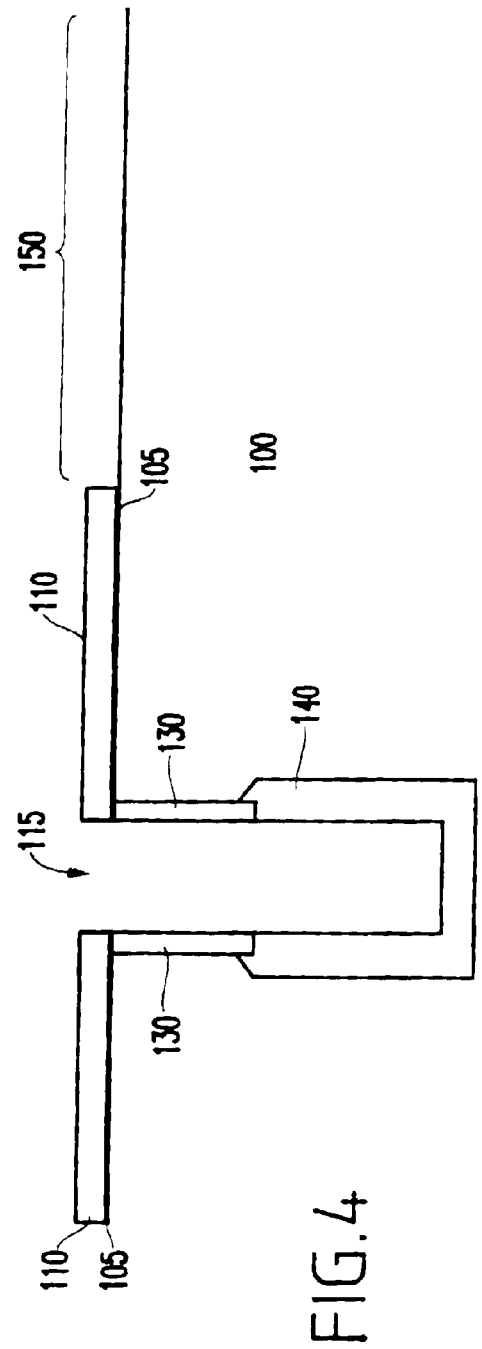
FIG. 4 is a schematic diagram of a partially completed DRAM structure according to the present invention.

In FIG. 4, the oxide layer 105 and the nitride layer 110 in the support area 150 are removed by patterned dry or wet etchings. Next, as shown in FIG. 5, a high-k dielectric 160 is deposited, which will be used as the trench dielectric as well as the gate dielectric for the support devices.

The deposition process used for the shared dielectric will be either Atomic Layer Chemical Vapor Deposition (ALCVD) or Metal-Organic Chemical Vapor Deposition (MOCVD). Both processes are compatible with standard CMOS processing, where conformal films are deposited over complex topographies, and employ chemical precursors readily available for the films of interest ($Al_2O_3$, $HfO_2$, $ZrO_2$, $La_2O_3$, $Ta_2O_3$, $SrTiO_3$, and combinations thereof).

The parameters for the ALCVD deposition of $Al_2O_3$ are given. Slight variations in chamber temperature, precursor flow rate (i.e. pulse length) and chamber pressures are required for the deposition of different metal oxides on different substrate topographies and chemical dispositions. The basic principle, however, remains consistent regardless of the material desired.

The dielectric will be able to be used with conventional semiconductor processing and will not crystalize at processing temperatures up to 1000° C. In order to maintain the elevated dielectric constant of the material and keep the electrical leakage to a minimum, the glass films (i.e. amorphous films) are used which maintain their non-crystalline structure at the elevated temperatures required in the fabrication of integrated circuit devices, such as deep trench capacitors.

This invention utilizes a process of raising a dielectric constant of the node dielectric via the utilization of mixtures of high-k oxides in molar ratios consistent with the formation of glass films. Such films are intended to remain amorphous at elevated temperatures and thus maintain low electrical leakage via the elimination of grain boundaries. For example, in the bulk, $La_2O_3$ and $Al_2O_3$ can be mixed in a ratio of 40 $La_2O_3$+60 $Al_2O_3$ to form a transparent glass with a critical cooling rate of less than 100 K/s. Thus, when deposited from the vapor phase, the cooling rate achieved with the inventive dielectric should be well in excess of the 100 K/s required to keep the glass vitreous (e.g., non-crystalline).

Furthermore, because the dielectric is amorphous a linear mixing law applies, which allows the dielectric constant of the resulting glass to be as great as 20 (the dielectric constants of $La_2O_3$ and $Al_2O_3$ are approximately 30 and 10, respectively) and thus more than a factor of 4 better than oxidized silicon nitride (which has a dielectric constant of approximately 4), and still larger than that of pure $Si_3N_4$ (k–7). Although, the fabrication of a two component glass is preferable from an ease of processing standpoint, it should be noted that the addition of a third or fourth oxide (e.g. $SiO_2$) is possible with the invention and could in fact be beneficial.

Moreover, mixing of oxides have been suggested for the fabrication of conventional gate oxides. In such cases, mixed oxides are formed as binary alloys consisting of dilute quantities of some high-k material (e.g. $ZrO_2$) with the balance made up of $SiO_2$ (generically referred to as "silicates"). In contrast, the glass films of the invention do not have to adhere to the stringent interfacial requirements of a CMOS device and as such they can employ oxides other than $SiO_2$. Such compositions lend themselves to enhanced dielectric characteristics applicable to DRAM storage devices.

As mentioned above, the implementation of a high-k material is desirable in integrated circuit technology, such as trench capacitor technology. Although there are numerous conventional materials from which to choose, most (e.g. $ZrO_2$, $HfO_2$) crystallize at temperatures below 1000° C. Because capacitor construction is a front end process, most high-k films will therefore deviltry (i.e., loose their amorphous structure and crystalize) and be susceptible to excessive electrical leakage and premature failure. To that end, an atomic layer chemical vapor deposition (ALCVD) process is used here in which glass forming combinations of $La_2O_3$ and $Al_2O_3$ are deposited for use as a high-k dielectric in trench capacitor technologies.

As illustrated in FIG. 6, a conductive material 165 is then deposited. The material can be doped polysilicon, or tungsten, or any proper refractory metal. This conductive material 165 will be used as the node conductor 170 of the trench as well as the gate conductor 180 of the support devices.

Figure 7:
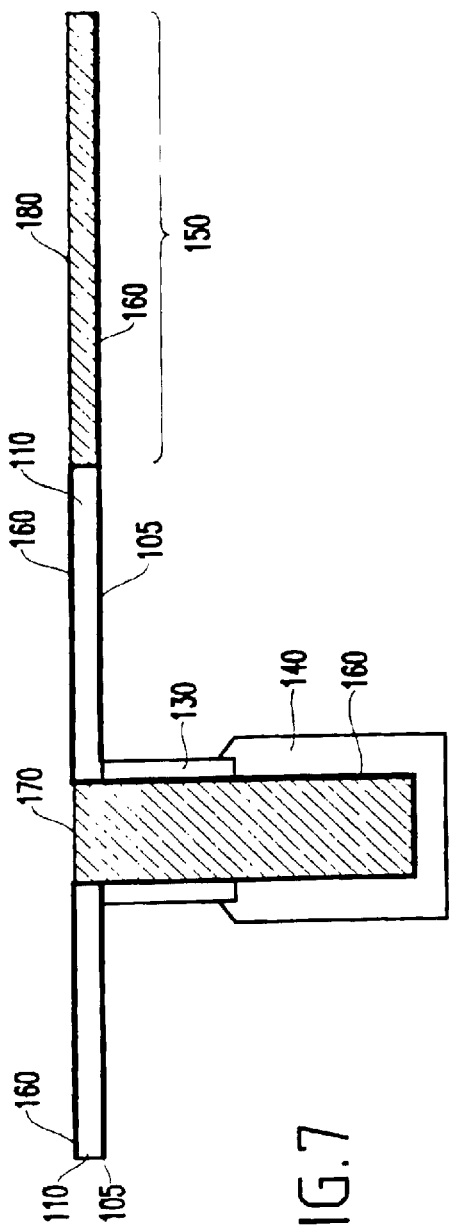
FIG. 7 is a schematic diagram of a partially completed DRAM structure according to the present invention.
Figure 8:
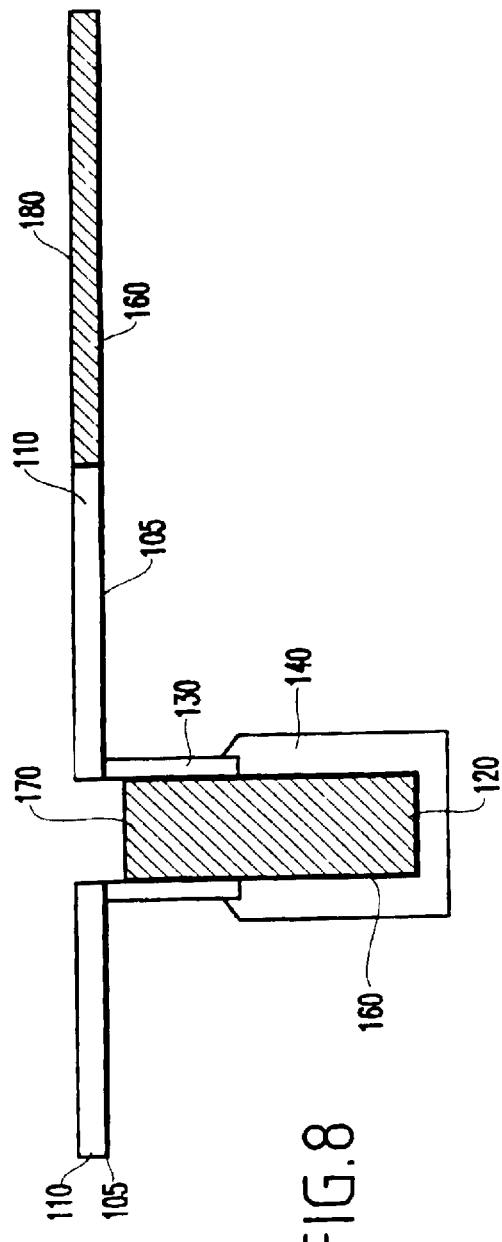
FIG. 8 is a schematic diagram of a partially completed DRAM structure according to the present invention.

FIG. 7 next shows a planarization process, (e.g. chemical-mechanical polish,) whereby the node conductor 170 is recessed slightly to become flush with the top surface of the trench and continues at the same height in the support area 150. The remaining conductive material 165 in the support area 150 will be used as the gate conductor material 180. Next, in FIG. 8, a second recess is performed with a mask whereby the gate conductor 170 is recessed in the deep trench region 120. The mask (not shown) is used to protect the gate material 180 in the support area 150. During this step, the high-k dielectric 160 is removed from the array area and also from both sides of the uppermost portions of the deep trench region 120. The high-k dielectric 160 remains in the rest of the deep trench region 120 to the bottom of the deep trench region 120.

FIG. 9 next illustrates an $n^+$ doped polysilicon 190 conductor being deposited and planarized back to the trench surface. Material 190 is butted to the silicon substrate 160 and will later form the strap by out-diffusion of the $n^+$ dopants into the substrate. An isotropic etch such as a wet type etch is used to remove the collar 130 from the exposed sides of the trench, and to recess the collar oxide 130 as shown in FIG. 9.

FIG. 10 shows a thin nitride layer 200 deposited on the wafer. Next, FIG. 11 shows shallow trench isolations 210 being formed in the substrate. A portion of the shallow trench is above the polysilicon surface 180. This is called a raised STI (shallow trench isolation) process. In FIG. 12 all of the exposed nitride layers 110 and 200 are removed using a wet or dry etching process. Then, a layer of doped polysilicon 220 is deposited on top of the substrate. This layer 220 will be the first conductive material for the array devices located in between the shallow trench isolation regions 210. Moreover, this layer 220 will be the second conductive material for the support devices (160, 180).

Figure 13:
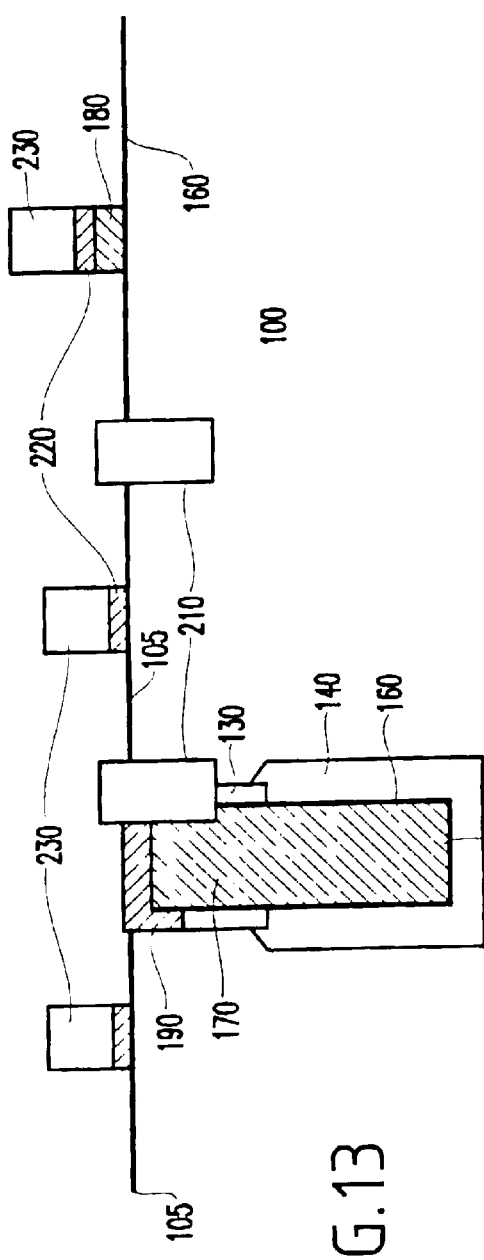
FIG. 13 is a schematic diagram of a partially completed DRAM structure according to the present invention.
Figure 14:
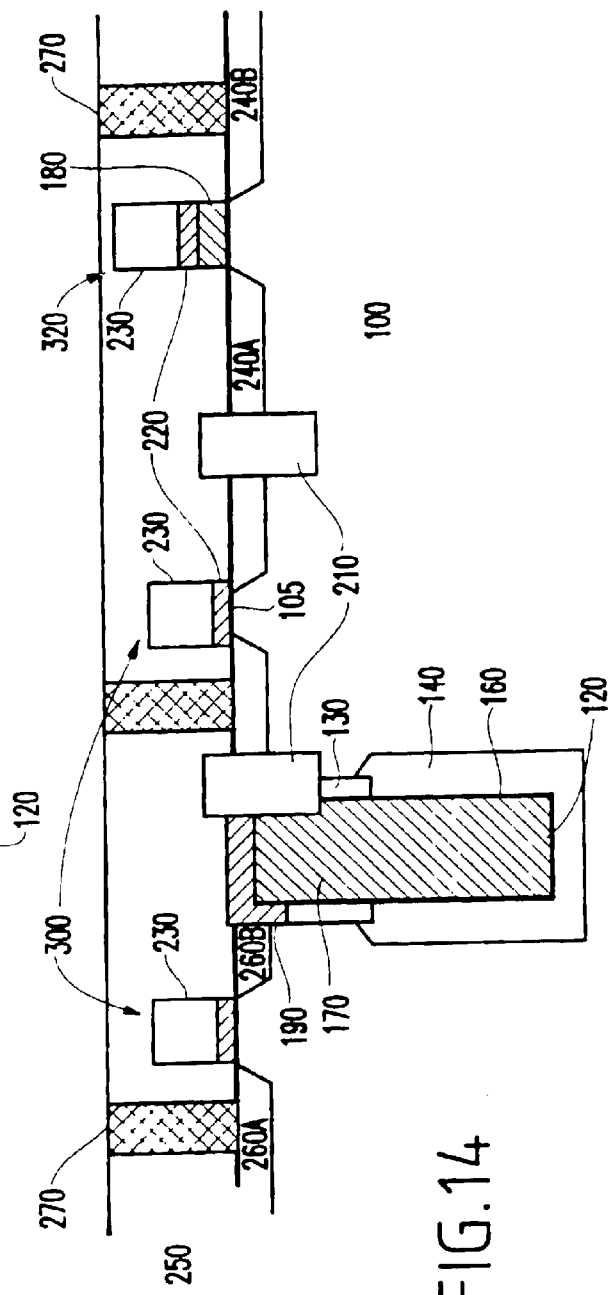
FIG. 14 is a schematic diagram of a completed DRAM structure according to the present invention.

Next, in FIG. 13, a conductive material 230, (e.g. tungsten, refractory metals, etc.,) is deposited. Also, the gate stacks (220, 230, and 180, 220, 230) are patterned to form transfer devices as well as the support devices. FIG. 14 then shows source/drain implants 260A and 260B implanted to form array devices 300, as well as source/drain implants 240A and 240B implanted to form support devices 320. An additional insulation layer 250 is added as well as contacts 270 to the devices.

Figure 15:
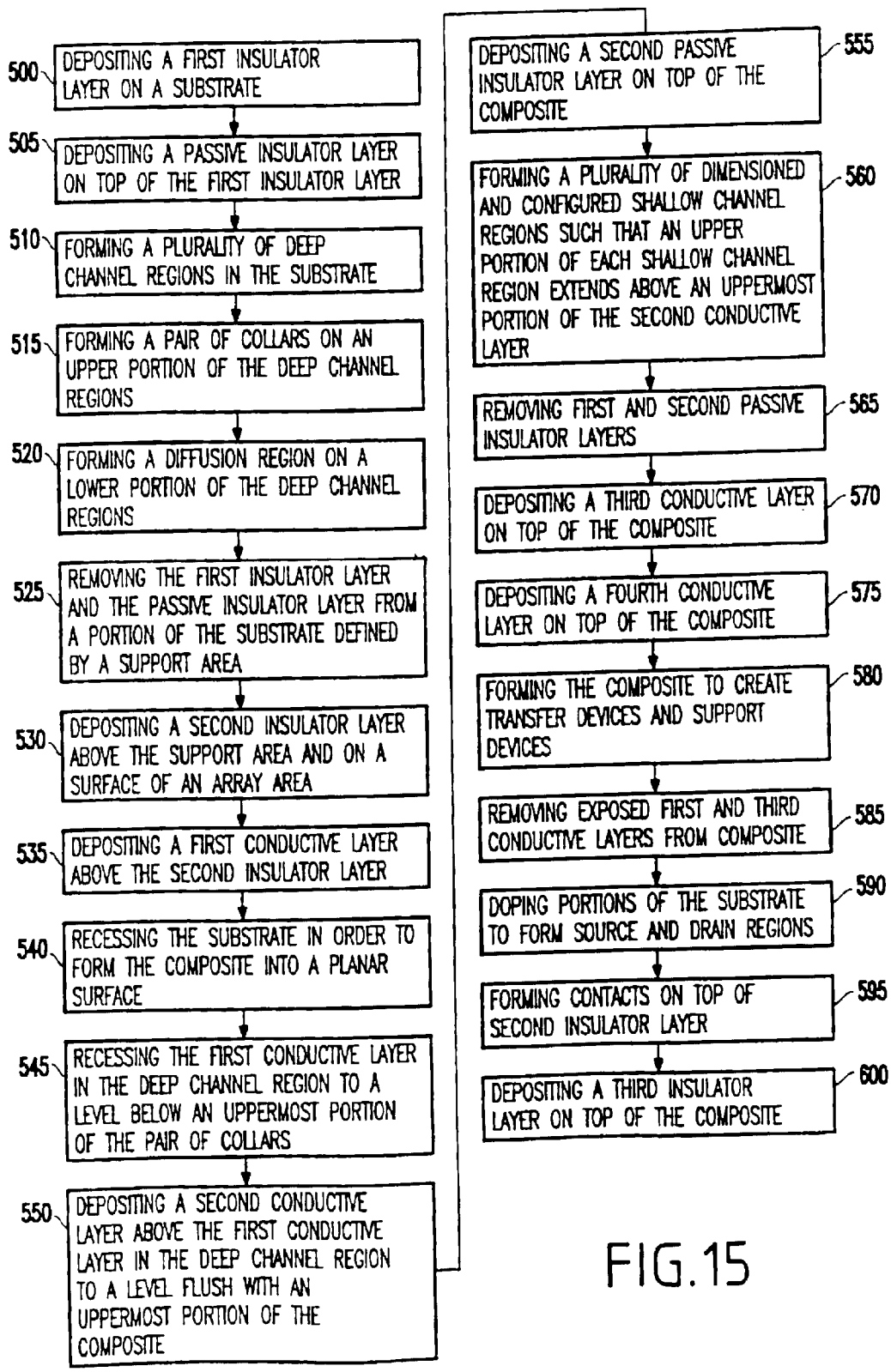
FIG. 15 is a flow diagram illustrating a preferred method of the present invention.

The inventive process is shown in the form of a flowchart in FIG. 15. More specifically, the inventive process first deposits 500 a first insulator layer 105 on a substrate 100. Second, the invention deposits 505 a passive insulator layer 110 on top of the first insulator layer 105. Third, the invention forms 510 a plurality of deep trench regions 115 on the substrate 100. Next, the invention forms 515 a pair of collars 130 on an upper portion of the deep trench region 115. Then, the invention forms 520 a diffusion region 140 on a lower portion 145 of the deep trench region 115. After which, the invention removes 525 the first insulator layer 105 and the passive insulator layer 110 from a portion of the substrate 100 defined by a support area 150. Next, the invention deposits 530 a second insulator layer 160 above the support area 150 and on a surface of an array area 105. After that, the invention deposits 535 a first conductive layer 165 above the second insulator layer 160. Then, the invention recesses 540 the first conductive layer 165 in order to form the composite into a planar surface.

The invention recesses 545 the first conductive layer 170 in the deep trench region 115 to a level at an uppermost portion of the pair of collars 130 and deposits 550 a second conductive layer 190 above the first conductive layer 170 in the deep trench region 115 to a level flush with an uppermost portion of the composite. Following that, the invention deposits 555 a second passive insulator layer 200 on top of the composite and forms 560 a plurality of shallow channel regions 210. An upper portion of each shallow channel region 210 extends above an uppermost portion of the second conductive layer 190. Then, the invention removes 565 first 100 and second 200 passive insulator layers and deposits 570 a third conductive layer 220 on top of the composite. Then, the invention deposits 575 a fourth conductive layer 230 on top of the composite. After that, the invention forms 580 the composite to create transfer devices and support devices 270, 300. Next, the invention removes 585 exposed first 165 and third 220 conductive layers from the composite and dopes 590 portions of the substrate to form source and drain regions 260A, 260B, 240A, 240B. Next, the invention forms 595 contacts on top of second insulator layer 160 and deposits 600 a third insulator layer 250 on top of the composite.

An important feature of the invention is that the same high-k dielectric 160 is used as both the node dielectric in the deep trench capacitors 120 and as the gate dielectric in the support devices 320. The advantages of using the same dielectric for different purposes is that where the capacitor and support device dielectrics are formed simultaneously, the thermal steps for both dielectric materials are combined, and hence will not degrade the material or electrical properties of one or the other material. A different dielectric 105 is used for the array devices because the array device dielectric 105 may be selected to optimize the off-current performance of the array device which is critical for data retention.

While the invention has been described in terms of preferred embodiments, those skilled in the art will recognize that the invention can be practiced with modification within the spirit and scope of the appended claims.

What is claimed is:

1. A method of producing a composite dynamic random access memory device, said method comprising:

forming at least one support device in a substrate, wherein said at least one support device is a high-k gate insulator; and forming at least one deep trench capacitor in a substrate, wherein said at least one deep trench capacitor has a high-k node dielectric; and wherein said high-k dielectric gate insulator and said high-k node dielectric comprising the same material.

2. The method of claim 1, further comprising forming a collar insulator and a diffusion region in said deep trench capacitor.

3. The method of claim 1, further comprising depositing a plurality of insulator layers on said substrate.

4. The method of claim 1, further comprising depositing a plurality of conductive layers on said substrate.

5. A method of producing a composite dynamic random access memory device, said method comprising:

forming at least one support device in a substrate, wherein said at least one support device has a high-k dielectric gate insulator;

forming at least one deep trench capacitor in a substrate, wherein said at least one deep trench capacitor has a high-k node dielectric, wherein said high-k dielectric gate insulator and said high-k node dielectric comprise the same material; and depositing a plurality of insulator layers on said substrate, wherein the step of depositing a plurality of insulator layers on said substrate further comprises using Atomic Layer Chemical Vapor Deposition(ALCVD).

6. A method of producing a composite dynamic random access memory device, said method comprising:

forming at least one support device in a substrate, wherein said at least one support device has a high-k dielectric gate insulator;

forming at least one deep trench capacitor in a substrate, wherein said at least one deep trench capacitor has a high-k node dielectric, wherein said high-k dielectric gate insulator and said high-k node dielectric comprise the same material; and depositing a plurality of insulator layers on said substrate, wherein the step of depositing a plurality of insulator layers on said substrate further comprises using Metal Organic Chemical Vapor Deposition(MOCVD).

7. A method of producing a composite dynamic random access memory device, said method comprising:

forming at least one support device in a substrate, wherein said at least one support device has a high-k dielectric gate insulator;

forming at least one deep trench capacitor in a substrate, wherein said at least one deep trench capacitor has a high-k node dielectric, forming a cold air insulator and a diffusion region in said deep trench capacitor, depositing a plurality of insulator layers on said substrate; and depositing a plurality of conductive layers on said substrate, wherein said high-k dielectric gate insulator and said high-k node dielectric comprise the same material.

8. The method of claim 7, wherein the step of depositing a plurality of insulator layers on said substrate further comprises using Atomic Layer Chemical Vapor Deposition (ALCVD).

* * * * *